United States Patent
Daudelin et al.

(10) Patent No.: US 8,773,893 B2
(45) Date of Patent: Jul. 8, 2014

(54) SYSTEM FOR POWERING UP VOLTAGE DOMAINS AFTER EXITING POWERDOWN EVENT

(75) Inventors: Darin James Daudelin, Williston, VT (US); Adam Bertrand Wilson, Cornwall, VT (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 215 days.

(21) Appl. No.: 13/447,269

(22) Filed: Apr. 15, 2012

(65) Prior Publication Data

US 2013/0272054 A1  Oct. 17, 2013

(51) Int. Cl.
*G11C 11/24* (2006.01)
(52) U.S. Cl.
USPC ........... 365/149; 365/150; 365/191; 365/194; 365/226
(58) Field of Classification Search
USPC .................... 365/149, 150, 191, 194, 226
See application file for complete search history.

(56) References Cited

U.S. PATENT DOCUMENTS

| | | | | |
|---|---|---|---|---|
| 5,801,576 A * | 9/1998 | Ooishi | ........................... | 327/530 |
| 7,176,745 B2 * | 2/2007 | Itoh et al. | ....................... | 327/534 |
| 7,602,634 B2 * | 10/2009 | Turner | ........................... | 365/149 |
| 7,733,682 B2 * | 6/2010 | Madan | ........................... | 365/145 |
| 7,772,917 B2 * | 8/2010 | Itoh et al. | ....................... | 327/534 |
| 8,526,260 B2 * | 9/2013 | Pyeon | ........................... | 365/222 |

* cited by examiner

*Primary Examiner* — Pho M Luu
(74) *Attorney, Agent, or Firm* — Winston Hsu; Scott Margo

(57) ABSTRACT

A system for charging a low voltage power domain in a low power DRAM includes: a first capacitor, for providing a local domain power voltage supply; a first transistor, coupled to the first capacitor and a voltage supply and turned on by a powerdown signal, the first transistor for decoupling the first capacitor during powerdown mode, and charging the capacitor to provide the local domain power voltage supply when exiting powerdown mode; a second capacitor selectively coupled to the voltage supply or the local domain voltage power supply; and a second transistor, coupled to the second capacitor, the powerdown signal, and the local domain power voltage supply, for decoupling the second capacitor from the local domain power voltage supply during powerdown mode and coupling the second capacitor to the local domain power voltage supply when exiting powerdown mode.

14 Claims, 5 Drawing Sheets

SYSTEM FOR POWERING UP VOLTAGE DOMAINS AFTER EXITING POWERDOWN EVENT

BACKGROUND OF THE INVENTION

1. Field of the Invention

The present invention relates to powering up voltage domains of a DRAM after exiting a powerdown event, and more particularly, to a system for enabling fast powering up of voltage domains of a DRAM after exiting a powerdown event.

2. Description of the Prior Art

In conventional low power DRAM design, during a powerdown event, local voltage power domains are also powered down. When exiting the powerdown event, all parasitic and decoupling capacitances attached to these local voltage power domains need to be recharged to their full amount, which could require a significant amount of time and could place a burden on the system. For instance, if normal operations resume before complete recharging has occurred, data maybe invalid.

In a conventional DRAM circuit, power is supplied to the local voltage power domains by either an external power supply or through a voltage regulator. Referring to FIG. 1 and FIG. 2 which are circuit diagrams illustrating conventional DRAM systems. FIG. 1 is a diagram of an unregulated power domain 100 of a DRAM, wherein a capacitor C is coupled between a Local Domain Power Supply voltage VLPD and ground. The coupling or decoupling of the capacitor C is according to a signal CKE which controls the powerdown operation of the DRAM. The system 100 also comprises an inverter 150, which is for inverting the signal CKE to generate an inverted signal CKEF.

In a powerdown operation, CKE will transition to low and CKEF will transition to high. CKEF is then input to the gate of a transistor (PMOS) P which is coupled between a supply Vcc and the Local Power Domain Supply voltage VLPD. This causes the transistor P to switch off, leaving VLPD floating. VLPD will eventually reach 0 volts over time. When powerdown mode is exited (CKE transitions to high, CKEF transitions to low so transistor P is turned on), capacitor C needs to be fully charged and VLPD needs to reach full potential before the system 100 is able to properly deal with commands issued by the DRAM.

FIG. 2 is a circuit diagram of a conventional DRAM system illustrating a regulated local power domain 200 of a DRAM. The system 200 includes a regulator 225 coupled to VLPD via its output. The regulator 225 is also supplied with a reference signal REF and the powerdown signal CKE. When CKE is in the low state, the regulator 225 will not supply an output to the capacitor C so that VLPD will be floating. VLPD will eventually reach 0 volts over time. When CKE is in the high state, the regulator 225 will perform the VLPD pull-up and charging of the capacitor C.

As stated above, when exiting powerdown mode, the decoupling capacitor C must be fully charged so that VLPD can reach full potential before commands are issued; otherwise, there is the risk of invalid data being generated. The size of the decoupling capacitances used in low power domains often means that a long time is required to fully charge the decoupling and parasitic capacitors. The time needed to charge up the capacitance could be reduced if the size of the decoupling capacitance were reduced. This, however, would result in large voltage drops during normal operations of the DRAM, and also increase the amount of noise in the system.

SUMMARY OF THE INVENTION

Therefore, it is an objective of the present invention to have a DRAM having smaller decoupling capacitance charges to minimize the time required before accessing the memory. This has the added benefit of reducing noise in the system.

A system for charging a low voltage power domain in a low power DRAM according to an exemplary embodiment of the system comprises: a first capacitor, for providing a local domain power voltage supply; a first transistor, coupled to the first capacitor and a voltage supply and turned on by a powerdown signal, the first transistor for decoupling the first capacitor during powerdown mode, and charging the capacitor to provide the local domain power voltage supply when exiting powerdown mode; a second capacitor selectively coupled to the voltage supply or the local domain voltage power supply; and a second transistor, coupled to the second capacitor, the powerdown signal, and the local domain power voltage supply, for decoupling the second capacitor from the local domain power voltage supply during powerdown mode and coupling the second capacitor to the local domain power voltage supply when exiting powerdown mode. In some embodiments, the system further comprises a delay circuit coupled between the first transistor and the second transistor, for receiving the powerdown signal and turning on the second transistor when exiting powerdown mode according to the powerdown signal, wherein the second transistor is turned on at a delay time after the first transistor is turned on. The delay circuit is a NAND gate with hysteresis in some embodiments.

A method for charging a low voltage power domain in a low power DRAM comprises: generating a powerdown signal for a low power DRAM to enter powerdown mode; decoupling a first capacitor from a voltage supply during a powerdown mode, decoupling a second capacitor from the local domain power voltage supply and coupling the second capacitor to the voltage supply according to the powerdown signal; making the powerdown signal undergo a level transition when the DRAM exits powerdown mode; charging the first capacitor to provide the local domain power voltage supply according to the powerdown signal undergoing the level transition; and decoupling the second capacitor from the voltage supply and coupling the second capacitor to the local domain power voltage supply according to the powerdown signal undergoing the level transition.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a system that speeds up capacitor charging times when exiting powerdown mode by splitting the capacitance for the system into a reduced decoupling capacitor and a secondary capacitor. The reduced decoupling capacitance means that local voltage power domains can be quickly powered up when exiting a powerdown event, while the use of the secondary capacitor can prevent large voltage drops from occurring during normal power operation. The system and method disclosed in the present invention can be applied to both unregulated and regulated local voltage power domains of low power DRAMs.

Figure 1:
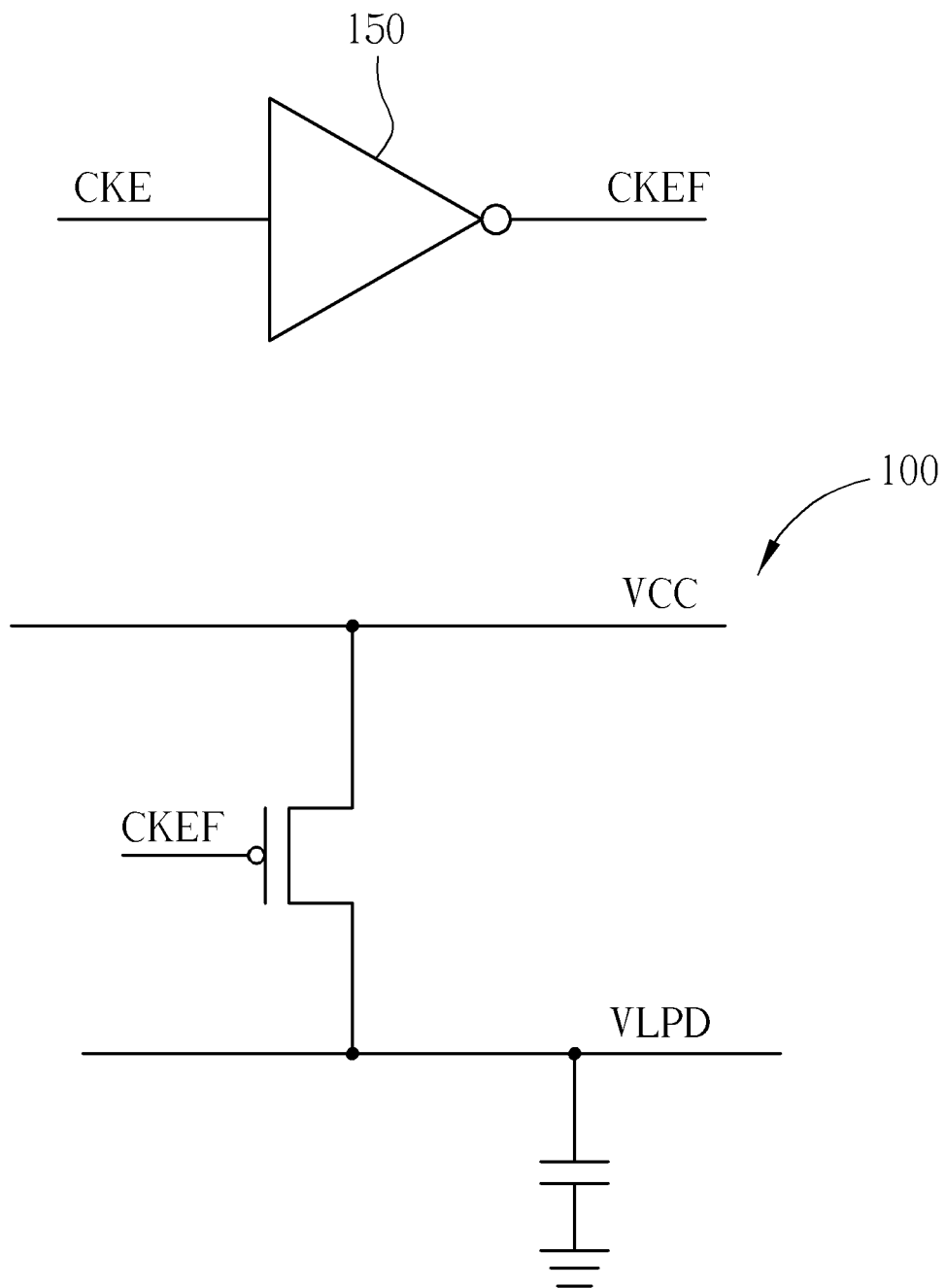
FIG. 1 is a circuit diagram showing a conventional unregulated DRAM device.
Figure 2:
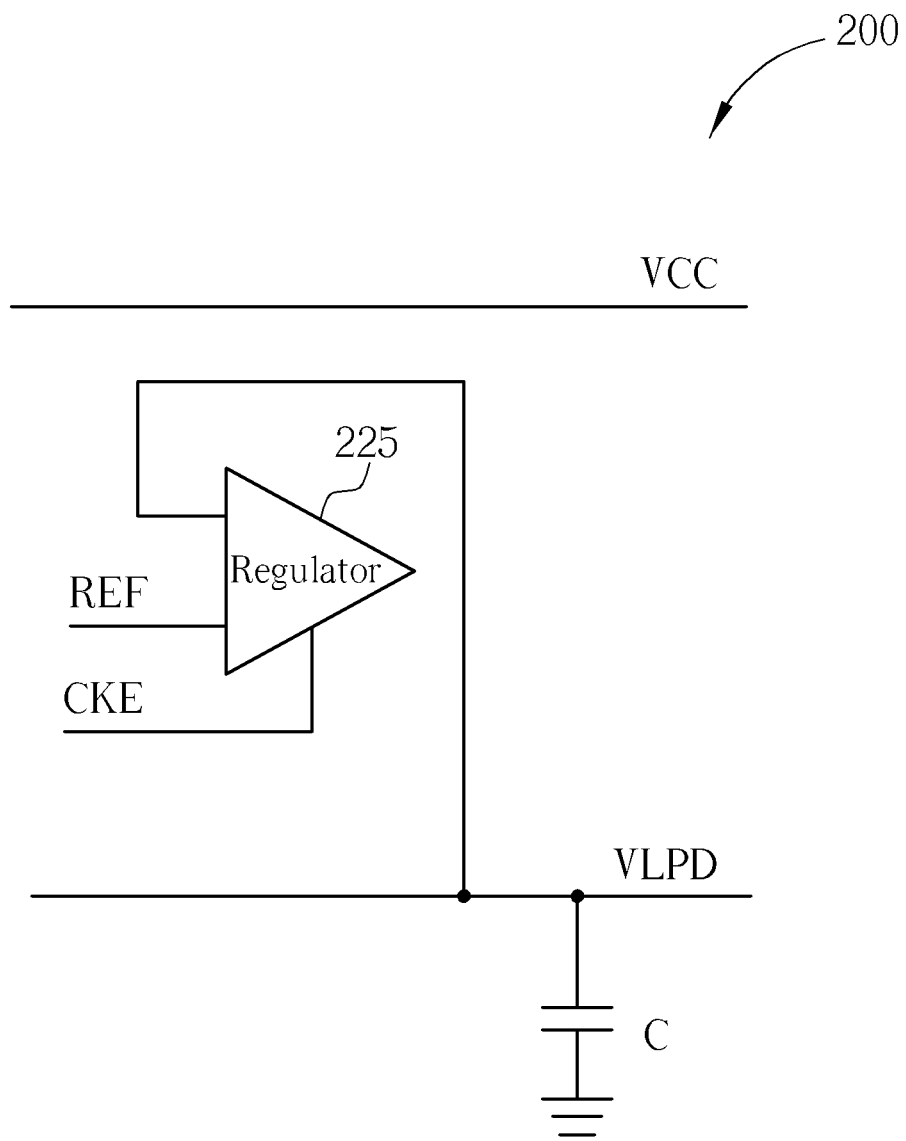
FIG. 2 is a circuit diagram illustrating a conventional regulated DRAM device.
Figure 3:
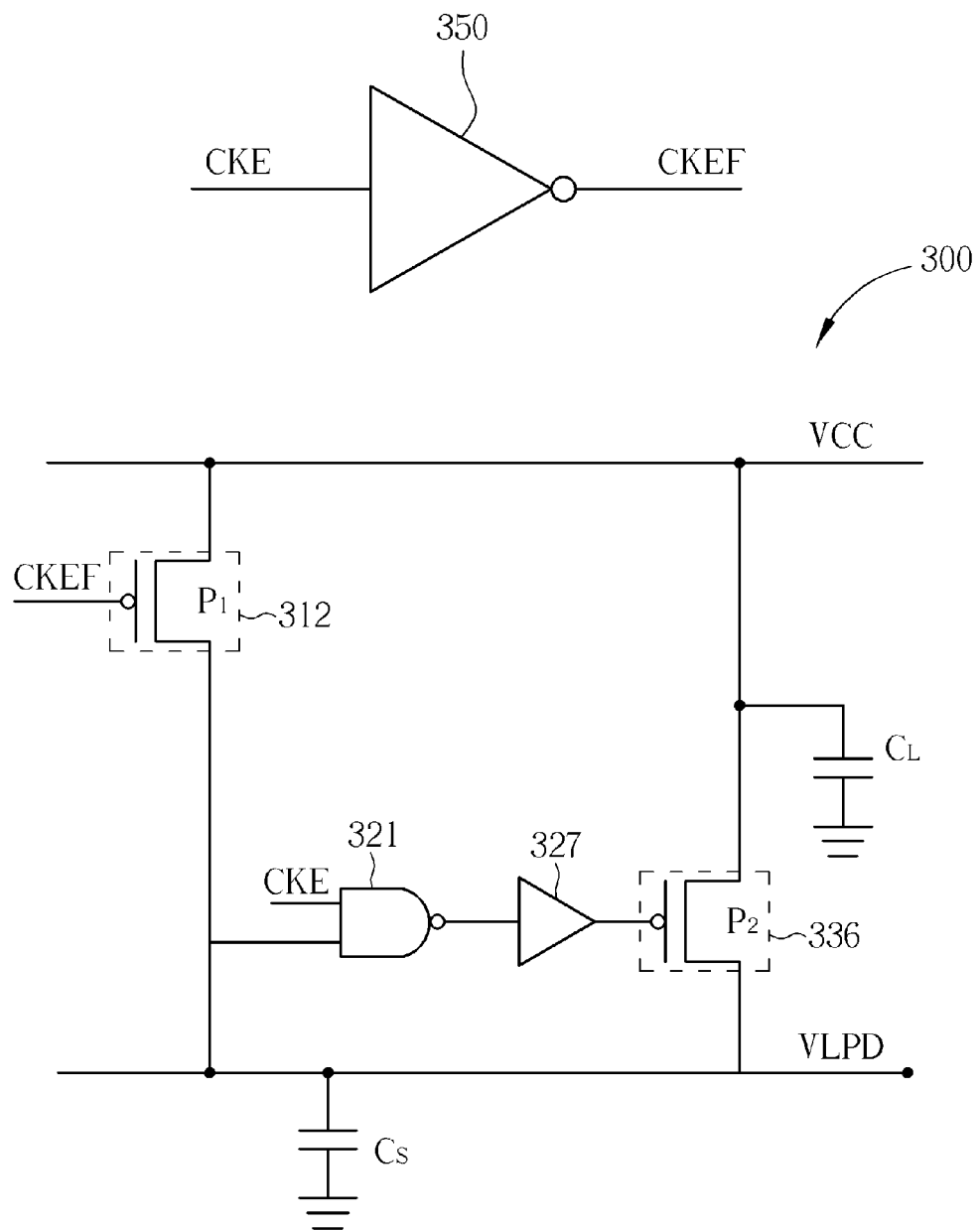
FIG. 3 is a circuit diagram depicting an unregulated DRAM according to an exemplary embodiment of the present invention.

Please refer to FIG. 3, which is a circuit diagram of an unregulated local voltage power domain 300 in a DRAM according to an exemplary embodiment of the present invention. As shown in the diagram, the system comprises a first capacitor CS and a second capacitor CL. The first capacitor CS is coupled between VLPD and ground. The second capacitor CL is coupled to a delay circuit consisting of a NAND gate 321 coupled in turn to a delay circuit 327 and a PMOS transistor 336 (P2). The NAND gate 321 is designed to have a certain amount of hysteresis. Note that the NAND gate 321 is one embodiment and any circuit that has a certain amount of hysteresis could be used instead. For example, the NAND gate 321 could be replaced with a Schmitt trigger in an alternative embodiment.

The system 300 also comprises a PMOS transistor 312 (P1), which is coupled between Vcc and VLPD, and further coupled to one of the inputs of the NAND gate 321. An inverter 350 is used for inverting the powerdown signal CKE to generate an inverted powerdown signal CKEF. The inverted powerdown signal CKEF is coupled to the gate of P1. In this embodiment, the capacitor CL is coupled to the power supply Vcc. Furthermore, the specific size of the decoupling capacitances of capacitors CS, CL can be determined according to requirements, but the decoupling capacitance CS should be relatively small in comparison to CL.

The operation of the system 300 will be described below. When CKE is in a low state, the system is in powerdown mode. When CKE is in a high state, the system has exited powerdown mode. In powerdown mode, CKEF is in a high state which causes P1 312 to turn off, allowing VLPD to float. VLPD will eventually reach 0 volts over time, which means that capacitor CS is discharged. Capacitor CL, however, is still coupled to VCC and therefore remains fully charged. The signal CKE in the low state also causes P2 336 to be turned off via the NAND gate 321 and delay circuit 327, so capacitor CL is only supplied with voltage Vcc.

When CKE is in a high state, i.e. CKEF is in a low state, the DRAM exits powerdown. When CKEF is in a low state this causes transistor P0 312 to turn on, so VLPD will be pulled back to its full potential by the external voltage supply. As the capacitance of capacitor Cs is much smaller than the decoupling capacitance of the prior art, however, the time needed to bring VLPD back to full potential is much shorter than in the conventional system 100. During powerdown mode, capacitor CL has remained coupled to Vcc and is therefore fully charged. When CKE goes high as the system exits powerdown mode, the connection between Vcc and CL will be turned off, and CL will then be supplied with the external voltage via transistor P1 312. With the hysteresis character of the NAND gate 321, CL will not be immediately introduced to the system 300. VLPD can therefore reach almost full potential before P2 336 is turned on and the extra capacitance of capacitor CL is introduced to the VLPD bus. The delay circuit 327 is utilized to help fine-tune the delay time before transistor P2 336 is turned on, and is adjustable according to practical requirements. The delay caused by the hysteresis of the NAND gate 321 and the delay circuit 327 can also ensure that voltage drops during normal operation of a DRAM will not turn off transistor P2 336.

Figure 4:
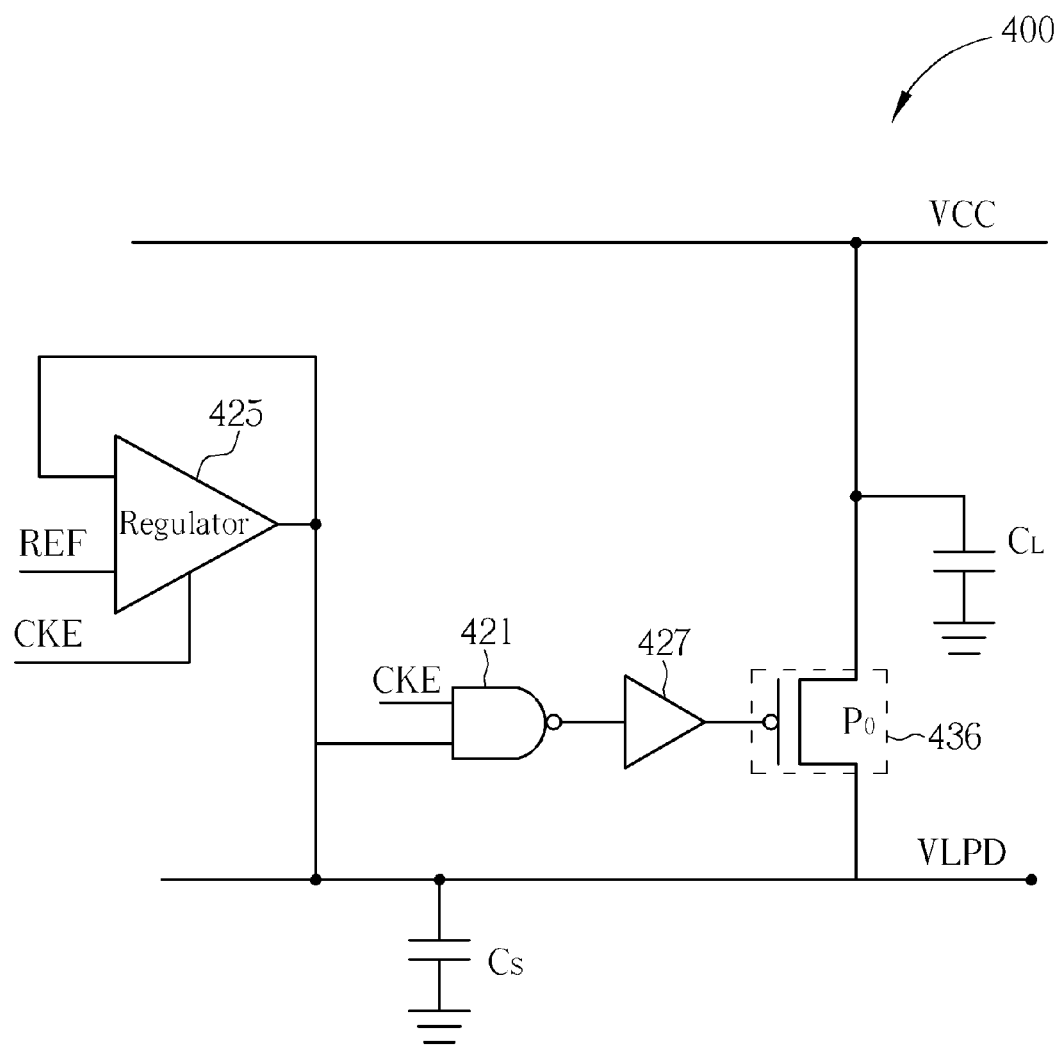
FIG. 4 is a circuit diagram illustrating a regulated DRAM according to another exemplary embodiment of the present invention.

Please refer to FIG. 4, which is a circuit diagram illustrating a regulated low voltage power domain 400 in a DRAM according to an exemplary embodiment of the present invention. The same principle of splitting the decoupling capacitance into two capacitors CS and CL is used in this system. The same principle is applied in order to reduce the amount of decoupling capacitance that needs to be charged when the DRAM exits powerdown mode. As shown in the diagram, system 400 comprises a NAND gate 421 coupled to a delay circuit 427 which is coupled in turn to transistor 436 (P0). Capacitor CL is coupled between P0 436, ground and the power supply Vcc. The powerdown signal CKE is also coupled to one of the inputs to the NAND gate 421 which is designed to have some hysteresis. As in system 300, the NAND gate 421 with hysteresis is merely one example and could be replaced with another electronic device that has hysteresis such as a Schmitt trigger. A regulator 425 is coupled to the Local Power Domain Supply voltage VLPD and also coupled to another input of the NAND gate 421. The regulator 425 is supplied with a reference signal REF and the powerdown signal CKE, and is used for generating the voltage VLPD to the system 400.

In powerdown mode, the regulator 425 will not output a voltage to the capacitor CS or the NAND gate 421, causing VLPD to float. VLPD will eventually reach 0 volts over time and cause P0 436 to turn off. In powerdown mode, the powerdown signal is in a low state. Capacitance at capacitor CL will therefore remain fully charged as it is coupled to Vcc. When CKE is in a high state, the device is in powerdown exit mode. When CKE is in a high state, CL is decoupled from Vcc. CKE will also turn on the regulator 425 and the NAND gate 421. The regulator 425 thereby outputs a voltage, causing VLPD to be pulled up, and P0 436 will be turned on after a certain delay amount dictated by the hysteresis of the NAND gate 421 and the delay circuit 427. Therefore, upon immediately exiting powerdown mode, only the smaller capacitance of capacitor CS needs to be charged, and the larger capacitance of capacitor CL will not be introduced to the VLPD bus until VLPD has almost reached its full potential.

Figure 5:
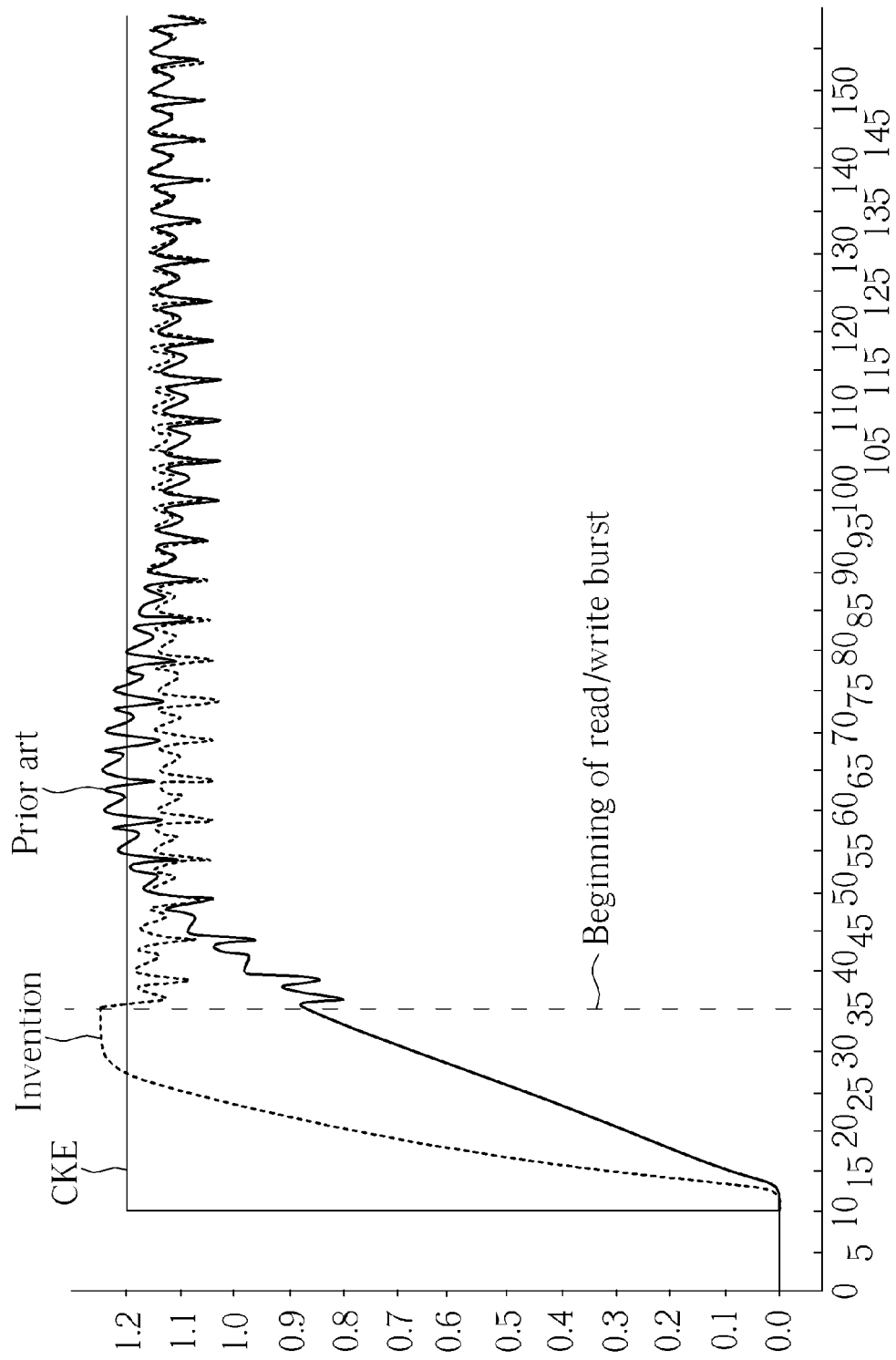
FIG. 5 is a chart showing operational results of a system of the present invention.

Please refer to FIG. 5, which is a chart showing operational results of a system exiting powerdown mode that has a large capacitance of a capacitor CL and a small capacitance of a capacitor CS as in the present invention, and a comparison waveform that represents operational results of a prior art system with a single capacitance C. $CS+CL=C_{TOTAL}=C$. In this example, the ratio of the capacitances CL:CS is 3:1; please note this is merely one possibility.

In the example shown in FIG. 5, the target voltage was taken to be 1.2V and an allowed voltage drop from the target was taken to be 150 mV; this means the supply voltage should not drop below 1.05V in order to maintain integrity of data. In addition, the amount of time until valid READ or WRITE command is generated after a powerdown exit can be represented by the equation tXP+tCD. According to a standard LPDDR1 spec, tXP is 6 ns and tCD is 15 ns. A clock cycle tCK is taken to be 5 ns meaning two clock cycles are needed for exiting powerdown mode: therefore, 2 tCK+tCD=25 ns.

In FIG. 5, the signal CKE is generated at 10 ns, and READ or WRITE bursts are generated 25 ns afterwards. By comparing the waveforms of the prior art and the present invention, it can be seen that the prior art voltage fails to meet the minimum voltage of 1.05V at the time the READ/WRITE bursts are generated. The voltage generated by the present invention, however, is above the target level of 1.2V when the READ/WRITE bursts are generated, and only falls by a small amount immediately after (caused by the capacitance of capacitor CL being introduced to the system). The voltage then maintains a steady level through subsequent operations, never falling below 1.05V. Eventually the two voltage waveforms are identical. Therefore, the present invention is able to provide a supply voltage that never falls below a minimum level after the system exits powerdown mode, in comparison with the prior art which is still below the minimum voltage at the initial time READ/WRITE bursts are generated.

In summary, the present invention divides decoupling capacitances for a local power domain into two capacitances, wherein a smaller capacitance will be decoupled during powerdown mode while the larger capacitance remains charged. When exiting powerdown mode, the system only needs to charge the smaller capacitance and therefore a Local Domain Power Supply voltage VLPD can quickly be pulled up to full potential. Incorporating a delay circuit with hysteresis for coupling the larger capacitance to the charging power supply means that the larger capacitance can be reintroduced to the system when VLPD is close to its full potential, so that VLPD can remain above a minimum level for all subsequent operations. The use of a delay circuit with hysteresis also ensures that CL will not be decoupled from the system due to large voltage drops occurring during normal operation. Therefore, the present invention provides a system that considerably speeds up charging time when exiting powerdown mode to prevent invalid data operations.

Those skilled in the art will readily observe that numerous modifications and alterations of the device and method may be made while retaining the teachings of the invention.

What is claimed is:

1. A system for charging a low voltage power domain in a low power DRAM, the system comprising:
    a first capacitor, for providing a local domain power voltage supply;
    a first transistor, coupled to the first capacitor and a voltage supply and turned on by a powerdown signal, the first transistor for decoupling the first capacitor from the voltage supply during powerdown mode according to the powerdown signal, and charging the capacitor to provide the local domain power voltage supply when exiting powerdown mode according to the powerdown signal;
    a second capacitor directly coupled to the voltage supply; and
    a second transistor, coupled to the second capacitor, the powerdown signal, and the local domain power voltage supply, for decoupling the second capacitor from the local domain power voltage supply during powerdown mode according to the powerdown signal and coupling the second capacitor to the local domain power voltage supply when exiting powerdown mode according to the powerdown signal;
    wherein the second capacitor will be coupled to the voltage supply during powerdown mode.

2. The system of claim 1, further comprising:
    a delay circuit coupled between the first transistor and the second transistor, for receiving the powerdown signal and turning on the second transistor when exiting powerdown mode according to the powerdown signal, wherein the second transistor is turned on at a delay time after the first transistor is turned on.

3. The system of claim 2, wherein the delay circuit comprises:
    a first delay circuit that receives the powerdown signal at a first input and the local domain power voltage supply from the first transistor at a second input and outputs the local domain power supply voltage after a first delay time; and
    a second delay circuit, coupled to the first delay circuit, for receiving the local domain power voltage supply and outputting the local domain power supply voltage to the second transistor after a second delay time;
    wherein the first delay time plus the second delay time equals the delay time.

4. The system of claim 3, wherein the first delay circuit is a hysteresis circuit.

5. The system of claim 3, wherein the first delay circuit is a NAND gate with hysteresis.

6. The system of claim 1, further comprising:
    a third transistor coupled between the voltage supply and the second capacitor, for receiving the powerdown signal and coupling the second capacitor to the voltage supply during powerdown mode according to the powerdown signal and decoupling the second capacitor from the voltage supply when exiting powerdown mode according to the powerdown signal.

7. The system of claim 1, wherein the first capacitor has a smaller capacitance than the second capacitor.

8. The system of claim 7, wherein a ratio of the capacitance of the first capacitor to the capacitance of the second capacitor is 1:3.

9. A method for charging a low voltage power domain in a low power DRAM, the method comprising:
    generating a powerdown signal for a low power DRAM to enter powerdown mode;
    decoupling a first capacitor from a voltage supply during a powerdown mode, decoupling a second capacitor from the local domain power voltage supply and coupling the second capacitor to the voltage supply according to the powerdown signal;
    making the powerdown signal undergo a level transition when the DRAM exits powerdown mode;
    charging the first capacitor to provide the local domain power voltage supply according to the powerdown signal undergoing the level transition; and
    decoupling the second capacitor from the voltage supply and coupling the second capacitor to the local domain power voltage supply according to the powerdown signal undergoing the level transition.

10. The method of claim 9, wherein the step of coupling the second capacitor to the local domain power voltage supply according to the powerdown signal undergoing the level transition further comprises:
    delaying the powerdown signal undergoing the level transition by a delay time; and
    coupling the second capacitor to the local domain power voltage supply after the delay time.

11. The method of claim 9, wherein the first capacitor has a smaller capacitance than the second capacitor.

12. The method of claim 11, wherein a ratio of the capacitance of the first capacitor to the capacitance of the second capacitor is 1:3.

13. A system for charging a low voltage power domain in a low power DRAM, the system comprising:
- a first capacitor, for providing a local domain power voltage supply;
- a first transistor, coupled to the first capacitor and a voltage supply and turned on by a powerdown signal, the first transistor for decoupling the first capacitor from the voltage supply during powerdown mode according to the powerdown signal, and charging the capacitor to provide the local domain power voltage supply when exiting powerdown mode according to the powerdown signal;
- a second capacitor directly coupled to the voltage supply;
- a second transistor, coupled to the second capacitor, the powerdown signal, and the local domain power voltage supply, for decoupling the second capacitor from the local domain power voltage supply during powerdown mode according to the powerdown signal and coupling the second capacitor to the local domain power voltage supply when exiting powerdown mode according to the powerdown signal; and
- a delay circuit coupled between the first transistor and the second transistor, for receiving the powerdown signal and turning on the second transistor when exiting powerdown mode according to the powerdown signal, wherein the second transistor is turned on at a delay time after the first transistor is turned on, the delay circuit comprising:
    - a NAND gate with hysteresis, that receives the powerdown signal at a first input and the local domain power voltage supply from the first transistor at a second input and outputs the local domain power supply voltage after a first delay time;
- wherein the second capacitor will be coupled to the voltage supply during powerdown mode.

14. The system of claim 13, wherein the delay circuit further comprises:
- a second delay circuit, coupled to the first delay circuit, for receiving the local domain power voltage supply and outputting the local domain power supply voltage to the second transistor after a second delay time;
- wherein the first delay time plus the second delay time equals the delay time.

* * * * *